(12) United States Patent
Jin et al.

(10) Patent No.: US 10,281,773 B2
(45) Date of Patent: May 7, 2019

(54) LIQUID CRYSTAL DISPLAY DEVICE

(71) Applicant: Japan Display Inc., Tokyo (JP)

(72) Inventors: Lu Jin, Tokyo (JP); Yosuke Hyodo, Tokyo (JP); Shinichiro Oka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/958,310

(22) Filed: Apr. 20, 2018

(65) Prior Publication Data
US 2018/0348556 A1    Dec. 6, 2018

(30) Foreign Application Priority Data

May 30, 2017 (JP) ................................ 2017-106697

(51) Int. Cl.
| | |
|---|---|
| G02F 1/1339 | (2006.01) |
| G02F 1/1335 | (2006.01) |
| G02F 1/1343 | (2006.01) |
| H01L 27/12 | (2006.01) |
| G02F 1/1333 | (2006.01) |

(52) U.S. Cl.
CPC .......... *G02F 1/1339* (2013.01); *G02F 1/1343* (2013.01); *G02F 1/13394* (2013.01); *G02F 1/133305* (2013.01); *G02F 1/133512* (2013.01); *G02F 1/133514* (2013.01); *H01L 27/124* (2013.01); *G02F 1/133528* (2013.01); *G02F 2201/121* (2013.01); *G02F 2201/123* (2013.01)

(58) Field of Classification Search
CPC ................. G02F 2001/133792; G02F 1/13454
See application file for complete search history.

(56) References Cited

U.S. PATENT DOCUMENTS

| | | | | |
|---|---|---|---|---|
| 6,705,584 B2 * | 3/2004 | Hiroshima | .......... | G02F 1/13394 249/155 |
| 2017/0059918 A1 | 3/2017 | Sasaki et al. | | |

FOREIGN PATENT DOCUMENTS

JP    2017-044714 A    3/2017

* cited by examiner

*Primary Examiner* — Phu Vu
(74) *Attorney, Agent, or Firm* — Typha IP LLC

(57) ABSTRACT

A liquid crystal display device includes a first substrate having a display region, a second substrate, a liquid crystal layer between the first substrate and the second substrate, a plurality of first spacers formed on one of the first substrate and the second substrate and contacting with another one thereof, and a plurality of second spacers formed on one of the first substrate and the second substrate and contacting with another one thereof, wherein the display region has a first region and a second region with a curvature of the first substrate larger than a curvature of the first region, the plurality of first spacers is arranged in the first region, the plurality of second spacers is arranged in the second region, and an arrangement density D2 of the plurality of second spacers is higher than an arrangement density D1 of the plurality of first spacers.

20 Claims, 17 Drawing Sheets

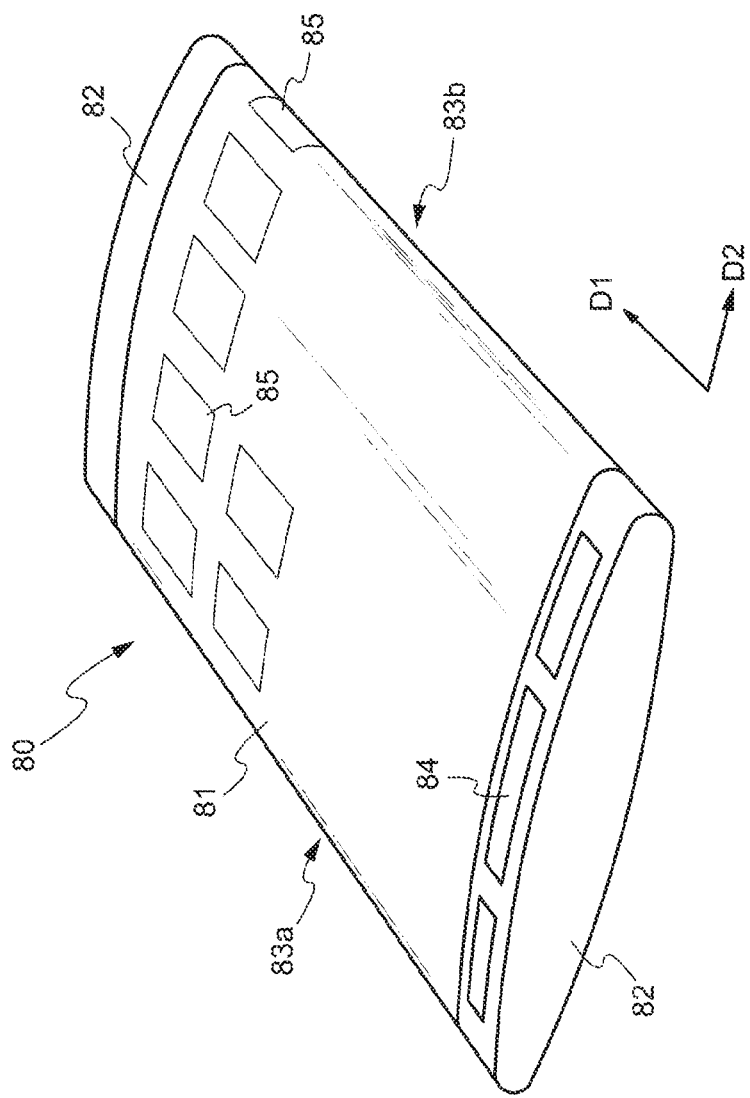

LIQUID CRYSTAL DISPLAY DEVICE

CROSS REFERENCE TO RELATED APPLICATIONS

This application is based on and claims the benefit of priority from the prior Japanese Patent Application No. 2017-106697, filed on May 30, 2017, the entire contents of which are incorporated herein by reference.

FIELD

The present invention relates to liquid crystal display devices and, in particular, to a liquid crystal display device using a substrate with flexibility as a support substrate.

BACKGROUND

Conventionally, a liquid crystal display device using a substrate with flexibility (hereinafter referred to as a "flexible substrate") as a support substrate has been known. The liquid crystal display device using the flexible substrate has pliability as a whole and can be bent, and thus has a merit of great versatility for use environments. As the flexible substrate, a resin substrate made of a resin material such as polyimide is generally used (Japanese Unexamined Patent Application Publication No. 2017-44714).

SUMMARY

A liquid crystal display device in one embodiment of the present invention includes a first substrate having a display region, a second substrate, a liquid crystal layer between the first substrate and the second substrate, a plurality of first spacers formed on one of the first substrate and the second substrate and contacting with another one thereof, and a plurality of second spacers formed on one of the first substrate and the second substrate and contacting with another one thereof, wherein the display region has a first region and a second region with a curvature of the first substrate larger than a curvature of the first region, the plurality of first spacers is between the first substrate and the second substrate in the first region, the plurality of second spacers is between the first substrate and the second substrate in the second region, and an arrangement density D2 of the plurality of second spacers is higher than an arrangement density D1 of the plurality of first spacers.

A display device in one embodiment of the present invention includes a first substrate having a display region, a second substrate, a liquid crystal layer between the first substrate and the second substrate, a plurality of first spacers formed on one of the first substrate and the second substrate and contacting with another one thereof, and a plurality of second spacers formed on one of the first substrate and the second substrate and contacting with another one thereof, wherein the display region has a first region and a second region with a curvature of the first substrate larger than a curvature of the first region, the plurality of first spacers is between the first substrate and the second substrate in the first region, the plurality of second spacers is between the first substrate and the second substrate in the second region, and a distance H2 between a top of the second spacers and a surface of either one of the first substrate and the second substrate where the second spacers are formed is longer than a distance H1 between a top of the first spacers and a surface of either one of the first substrate and the second substrate where the first spacers are formed.

A liquid crystal display device in one embodiment of the present invention includes a first substrate having a display region, a second substrate, a liquid crystal layer between the first substrate and the second substrate, a plurality of first spacers formed on the second substrate and contacting with the first substrate, and a plurality of second spacers formed on the second substrate and contacting with another the first substrate, wherein the display region has a first region and a second region with a curvature of the first substrate larger than a curvature of the first region, the plurality of first spacers is in the first region, the plurality of second spacers is in the second region, and a distance h2 between a bottom of the second spacers and a support substrate of the second substrate is longer than a distance h1 between a bottom of the first spacers and the support substrate.

BRIEF DESCRIPTION OF DRAWINGS

FIG. 17 is a perspective view depicting an electronic device having mounted thereon the liquid crystal display device of the present invention.

DESCRIPTION OF EMBODIMENTS

Figure 1:
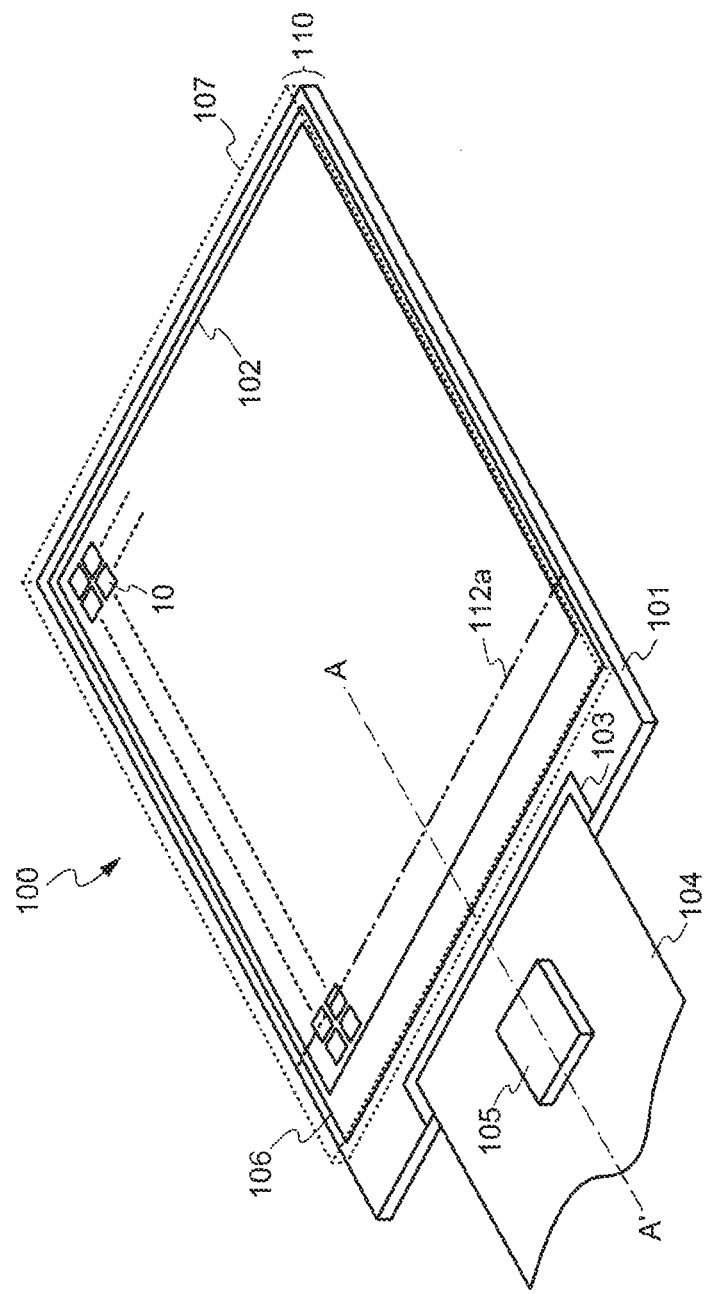
FIG. 1 is a perspective view depicting the structure of a liquid crystal display device of a first embodiment.

Japanese Unexamined Patent Application Publication No. 2017-44714 discloses a technique in which a liquid crystal layer is interposed between two insulating films with compressive stress to cause a force for pushing the liquid crystal layer from both side in a vertical direction to stable maintain a cell gap. That is, according to the technique described in Japanese Unexamined Patent Application Publication No. 2017-44714, with exertion of the force always pushing the liquid crystal layer from the vertical direction, the cell gap is advantageously not spread more than the height of the spacer.

However, Japanese Unexamined Patent Application Publication No. 2017-44714 does not mention maintenance of a cell gap of a curved part when the liquid crystal display device is bent. The liquid crystal display device using the flexible substrate is required to be bendable at various positions in accordance with use, and thus maintenance of the cell gap of the curved part can also become a large problem in the future.

The present invention is to provide a bendable liquid crystal display device with stable maintenance of a cell gap in a curved part.

In the following, each embodiment of the present invention is described with reference to the drawings and so forth. However, the present invention can be implemented in various modes in a range not deviating from the gist of the invention and should not be construed as being limited to the description of the embodiments illustrated below. Also, regarding the drawings, for more clarification of description, the width, thickness, shape, and so forth of each part or unit may be schematically represented, compared with actual modes. However, these schematic drawings are depicted by way of example and do not limit the interpretation of the present invention. Furthermore, in the specification and each drawing, a component including a function similar to that of a component in a drawing already described is provided with a reference character identical to that of the already-described component, and redundant description may be omitted.

Note in the specification and claims that expressions such as "above" and "below" for description of the drawings represent relative positional relations between a target structure and another structure. Specifically, when viewed from a side surface, a direction from a first substrate (array substrate) toward a second substrate (counter substrate) is defined as "above", and a direction opposite thereto is defined as "below".

Also, "inside" and "outside" represent relative positional relations of two areas with reference to a display section. That is, "inside" indicates a side relatively near the display section with respect to one area, and "outside" indicates a side relatively far from the display section with respect to one area. However, the definitions of "inside" and "outside" herein are assumed to be in a state in which the display device is not bent.

Also, in the specification, expressions such as "a includes A, B, or C", "a includes any of A, B, and C", and "a includes one selected from a group comprising A, B, and C" do not preclude a case in which a includes a plurality of combinations of A to C unless otherwise specified. Furthermore, these expressions do not preclude a case in which a includes another component.

A "liquid crystal display device" refers to refers to a general display device that displays images using a liquid crystal layer. For example, the term "liquid crystal display device" may indicate a display cell including a liquid crystal layer or may indicate a structure having another optical member (for example, a polarizing member, backlight, cover member, touch panel, or the like) attached to a display cell.

First Embodiment

<Structure of Liquid Crystal Display Device>

First, a schematic configuration of a liquid crystal display device 100 of a first embodiment is described. FIG. 1 is a perspective view of a schematic configuration of the liquid crystal display device 100 in the first embodiment.

The liquid crystal display device 100 has an array substrate 101, a flexible printed circuit board 104, a drive circuit 105, a sealant 106, and a counter substrate 107. For simplification of description, optical members such as a polarizing member and a backlight are omitted in FIG. 1, however, these optical members may be arranged.

The array substrate 101 is a substrate having a thin-film transistor and a plurality of pixels 10 including pixel electrodes connected to the thin-film transistor provided on a substrate with flexibility (for example, a resin substrate).

The array substrate 101 has a display region 102 and a terminal region 103. The display region 102 is a region where a plurality of pixels 10 are arrayed in a row direction and a column direction. The terminal region 103 is a region where a connection terminal for supplying a video signal from outside or the like to the display region 102 is formed. The connection terminal is configured with integration of wirings connected to the respective pixels 10.

Each pixel 10 includes a circuit using a thin-film transistor as a switching element. By controlling ON/OFF operation of the switching element in response to a supplied video signal, each pixel 10 performs orientation control over liquid crystal molecules corresponding to a pixel electrode included in the pixel 10.

Figure 2:
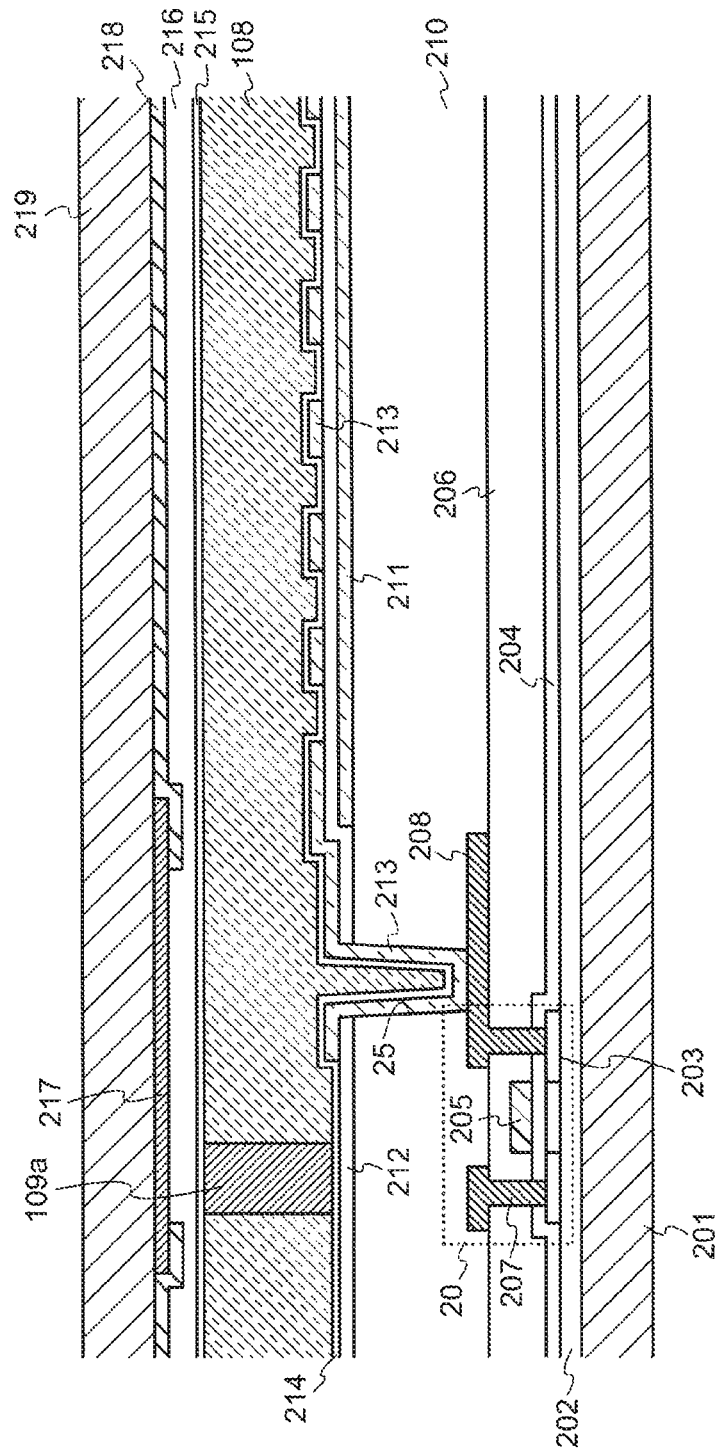
FIG. 2 is a sectional view depicting the structure of a pixel structure of the liquid crystal display device of the first embodiment.

Here, the pixel 10 is briefly described. FIG. 2 is a sectional view depicting the configuration of a pixel structure of the liquid crystal display device 100 in the first embodiment.

In FIG. 2, on a front surface of a first resin substrate configured of a resin material such as polyimide, an undercoat layer 202 configured of an inorganic insulating material is provided. Above the undercoat layer 202, a thin-film transistor 20 is provided.

The thin-film transistor 20 includes a semiconductor layer 203, a gate insulating layer 204, a gate electrode 205, an insulating layer 206, a source electrode 207, and a drain electrode 208. These components can be configured of known materials.

Above the thin-film transistor 20, a resin layer 210 configured of a resin material such as acrylic is provided, planarizing undulations due to the thin-film transistor 20. Above the resin layer 210, a common electrode 211 configured of a transparent conductive film made of ITO (Indium Tin Oxide) or the like is provided. Above the common electrode 211, a pixel electrode 213 is provided via an insulating layer 212.

As the insulating layer 212, an inorganic insulating film such as, for example, a silicon oxide film or silicon nitride film can be used, although not limited thereto. Also, as with the common electrode 211, the pixel electrode 213 is configured of a transparent conductive film made of ITO or the like. The pixel electrode 213 is electrically connected to the drain electrode 208 via a contact hole 25 provided in the resin layer 210 and the insulating layer 212. While it seems that a plurality of pixel electrodes 213 are provided in FIG. 2, the pixel electrode 213 in a planar view has, in practice, a comb-like pattern shape. That is, the pixel electrode 213 in a planar view has a shape with a plurality of adjacently-arranged linear electrodes connected at one end.

In the present embodiment, an electric field (horizontal electric field) is formed between the common electrode 211 and the pixel electrode 213. A mode using a horizontal electric field as described above is referred to as an IPS (In-Plain Switching) mode. Also, in the IPS mode, as in the present embodiment, a mode using a horizontal electric field when the common electrode 211 and the pixel electrode 213 are arranged so as to overlap (in this case, the horizontal electric field is referred to as a fringe electric field) is referred to as FFS (Fringe Field Switching) mode.

However, any other liquid crystal display mode may be used. For example, a mode using a horizontal electric field formed by using a pixel electrode and a common electrode provided in the same layer may be used. Also, VA (Vertical Alignment) mode may be used, in which a vertical electric field is formed between a pixel electrode provided on an array substrate side and a common electrode provided on a counter electrode side to control liquid crystal orientation in that vertical electric field.

Above the pixel electrode 213, an alignment film 214 is provided. In the present embodiment, components from the first resin substrate 201 to the alignment film 214 are collectively referred to as the array substrate 101. To the pixel electrode 213, a video signal is supplied via the thin-film transistor 20. The video signal is supplied to the source electrode 207 of the thin-film transistor 20 and is transmitted to the drain electrode 208 by the control of the gate electrode 205. As a result, the video signal is supplied from the drain electrode 208 to the pixel electrode 213.

Above the alignment film 214, a liquid crystal layer 108 is retained. As described above, the liquid crystal layer 108 is retained by being surrounded by the sealant 106 between the array substrate 101 and the counter substrate 107. Also, inside the region surrounded by the sealant 106, the liquid crystal layer 108 and also a first spacer 109a are arranged. The first spacer 109a is formed on, for example, one of the array substrate 101 and the counter substrate 107 and makes contact with the other thereof. The first spacer 109a can be formed by using, for example, a photo-sensitive resin material.

Above the liquid crystal layer 108, an alignment film 215 on a counter substrate 107 side is provided. Above the alignment film 215, an overcoat layer 216 is provided. The overcoat layer 216 planarizes undulations due to a light-shielding member 217 configured of a resin material containing a black pigment or black metal material and a color filter member 218 configured of a resin material containing a pigment or dye corresponding to each color of RGB.

Above the light-shielding member 217 and the color filter member 218, a second resin substrate 219 configured of a resin material such as polyimide is provided. In practice, the light-shielding member 217, the color filter member 218, the overcoat layer 216, and the alignment film 215 are laminated above one surface of the second resin substrate 219 to configure the counter substrate 107. When the moisture permeability of the resin substrate 219 is high, for improvement in resistance to water, an inorganic insulating film made of silicon nitride, silicon oxide, or the like may be formed between the second resin substrate 219 and the color filter member 218.

As described above, the display region 102 of the present embodiment has the plurality of pixels 10 having the structure described by using FIG. 2.

With reference to FIG. 1 again, the flexible printed circuit board 104 is electrically connected to the terminal region 103 to supply an external video signal, drive signal, and so forth. The flexible printed circuit board 104 is configured with a plurality of wirings arranged on a resin film and is bonded to the terminal region 103 via an anisotropic conductive film or the like. The flexible printed circuit board 104 is provided with the drive circuit 105 configured of an IC chip.

The drive circuit 105 supplies each pixel 10 with a video signal to be supplied to the pixel electrode of each pixel 10 and a drive signal for controlling the thin-film transistor of each pixel 10. In FIG. 1, an example is depicted in which the drive circuit 105 configured of an IC chip for controlling the thin-film transistor configuring each pixel 10 is provided to the flexible printed circuit board 104. However, a drive circuit such as a gate driver circuit or a source driver circuit can be provided around the display region 102 by using a thin-film transistor. Also, the drive circuit 105 configured of an IC chip can be provided on the array substrate 101 outside the sealant 106 in COG (Chip On Glass) mode.

The sealant 106 bonds the array substrate 101 and the counter substrate 107 together, and also retains the liquid crystal layer 108 (refer to FIG. 2) between the array substrate 101 and the counter substrate 107. Also, a gap (also referred to as a cell gap) between the array substrate 101 and the counter substrate 107 is maintained by the first spacer 109a depicted in FIG. 2 and a second spacer 109b, which will be described further below. The second spacer 109b is a spacer formed on one of the array substrate 101 and the counter substrate 107 and in contact with the other thereof.

For simplification of the drawing, the counter substrate 107 is indicated by dotted lines in FIG. 1. Also, although not depicted in FIG. 1, the counter substrate 107 includes a light-shielding member and a color filter member. In the specification, a structure including the array substrate 101, the sealant 106, the counter substrate 107, the liquid crystal layer 108, a first spacer 109a and a second spacer 109b is hereinafter referred to as a liquid crystal cell 110.

The sealant 106 is a resin material provided in a rectangular shape so as to surround the liquid crystal layer 108. The sealant 106 serves as a gate for preventing the inner liquid crystal layer 108 from flowing out to the outside and also serves a function of preventing inflow of moisture and oxygen from the outside.

The first spacer 109a is a resin member provided separately from the sealant 106 inside the sealant 106. Specifically, the first spacer 109a is arranged near each of points of intersection of a plurality of scanning lines (not depicted) and video signal lines (not depicted) provided on the display region 102, serving as a function of maintaining a cell gap. Here, the first spacer 109a is preferably arranged between a blue sub-pixel and a red sub-pixel. That is, it is preferable that one first spacer 109a be arranged for every three or six sub-pixels. A green sub-pixel has a high luminance compared with other sub-pixels, and a decrease in luminance can thus be reduced if the first spacer 109a is not arranged near any green sub-pixel. The second spacer 109b will be described further below.

In FIG. 1, a two-dot-chain line 112a depicted inside the sealant 106 indicates a position where the liquid crystal display device 100 is bent (a position where bending starts), as will be described further below. In this manner, the bending position of the liquid crystal cell 110 indicated by the two-dot-chain line 112a is inside the sealant 106. Therefore, the display region 102 and the liquid crystal layer 108 also exist in a curved part of the liquid crystal cell 110.

Figure 3:
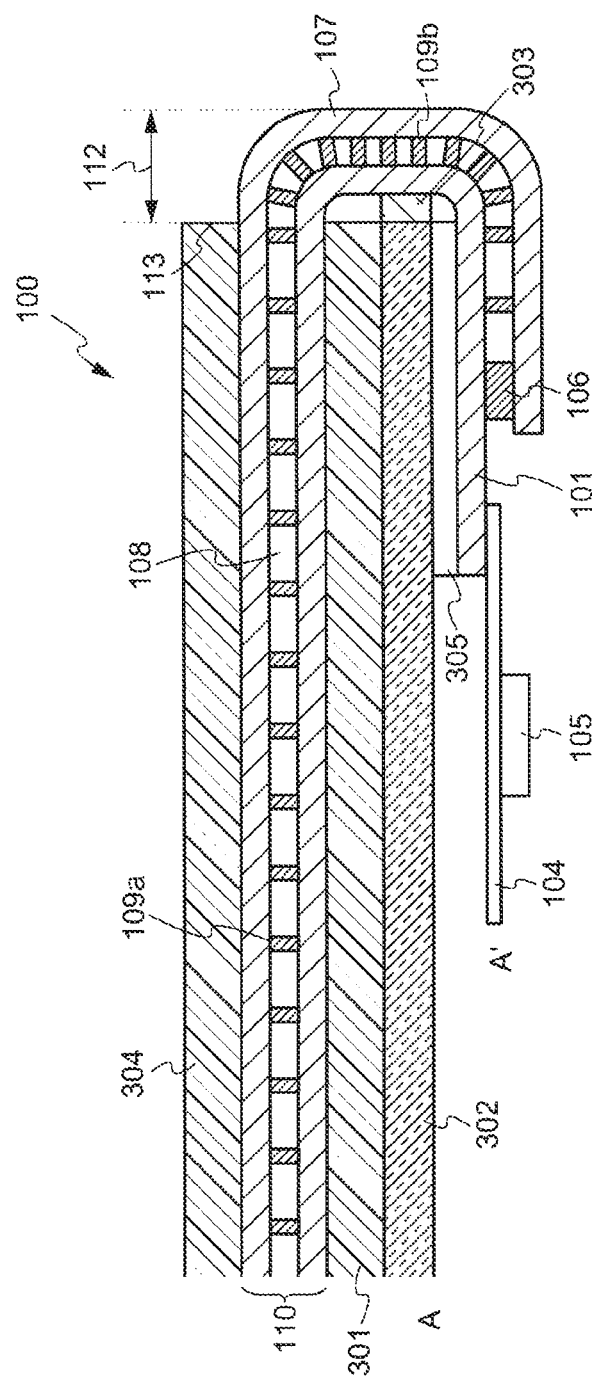
FIG. 3 is a sectional view depicting the structure of the liquid crystal display device of the first embodiment.

FIG. 3 is a diagram depicting a sectional configuration of the liquid crystal display device 100 of the first embodiment. Specifically, FIG. 3 depicts a state of the liquid crystal display device 100 depicted in FIG. 1 as being cut along a one-dot-chain line A-A' and partially bent.

In FIG. 3, of two surfaces of the array substrate 101, a surface opposing (facing) the counter substrate 107 is defined as a front surface, and a surface opposite to the front surface is defined as a back surface. Similarly, of two surfaces of the counter substrate 107, a surface opposing (facing) the array substrate 101 is defined as a front surface, and a surface opposite to the front surface is defined as a back surface. Therefore, the liquid crystal layer 108 is retained as interposed between the front surface of the array substrate 101 and the front surface of the counter substrate 107 inside the sealant 106.

In the liquid crystal display device 100 of the present embodiment, a polarizing member 301, a light-guiding member 302, and a light source 303 are arranged on the back surface side of the array substrate 101 so as to be overlapped on the display region 102. Here, the polarizing member 301 and the light-guiding member 302 are configured as interposed on the back surface side of the array substrate 101. Also, the light source 303 is arranged on a side surface of the light-guiding member 302. As the light source 303, for example, an LED light source can be used. The light-guiding member 302 and light source 303 configure an illuminating device (backlight).

On the back surface side of the counter substrate 107, the polarizing member 304 is arranged. With this, light emitted from the light source 303 is guided by the light-guiding member 302 to the polarizing member 301 and is recognized by an observer via the liquid crystal cell 110 and the polarizing member 304. In the specification and claims, an optically acting member such as a polarizing member, a light-guiding member, or a light source may be referred to as an "optical member".

Here, the example is described in which a polarizing member and an illuminating device are provided as members other than the liquid crystal cell 110. In another example, another optical member (such as a retardation plate or antireflection plate) or a touch panel may further be provided. For these optical member and touch panel, a known member or a known structure can be used.

In the present embodiment, an insulating layer 305 is provided as a cushioning member in order to avoid a contact between the back surface of the array substrate 101 and the light-guiding member 302. As the insulating layer 305, for example, a resin layer can be used. As a matter of course, the insulating layer 305 can be omitted. Also, when the drive circuit 105 is provided on the array substrate 101 in COG method, the configuration may be such that the drive circuit 105 is covered with the insulating layer 305 for protection.

Meanwhile, in the liquid crystal display device 100 of the present embodiment, a substrate with flexibility (for example, a resin substrate) is used as a support substrate of the array substrate 101. Thus, the array substrate 101 has flexibility as a whole. Similarly, a substrate with flexibility is used as a support substrate of the counter substrate 107, and thus the counter substrate 107 also has flexibility as a whole. Therefore, the display device 100 of the present embodiment can be bent so that the flexible printed circuit board 104 is arranged on the back surface side of the liquid-crystal cell 110, as depicted in FIG. 3.

In the liquid crystal display device 100 of the present embodiment, the bent portion is referred to as a "curved part". As depicted in FIG. 3, the liquid crystal display device 100 has a curved part 112 inside the sealant 106. Here, the liquid crystal cell 110 is bent along the two-dot-chain line 112a depicted in FIG. 1, and thus a region with a curvature larger than that of other regions is present outside the two-dot-chain line 112a.

As described above, the liquid crystal display device 100 of the present embodiment is configured to have the curved part 112 inside the sealant 106, and thus it is preferable to pay attention to fluctuations of the cell gap in the curved part 112. For example, in the curved part 112, the cell gap tends to fluctuate due to a force acting in a direction of crushing the liquid crystal layer 108.

Thus, in the present embodiment, the density of the arranged spacers is set varied between the display region 102 and the curved part 112. Specifically, the density of the spacers arranged in the curved part 112 is set higher than the density of the spacers arranged in the display region 102.

Here, spacers arranged in the display region 102 are referred to as the first spacers 109a, and a density of arrangement of the first spacers 109a is set as an "arrangement density D1". Also, spacers arranged in the curved part 112 are referred to as the second spacers 109b, and a density of arrangement of the second spacers 109b is set as an "arrangement density D2".

As depicted in FIG. 3, the first spacers 109a are arranged at an arrangement density D1 in the display region 102. Also, the second spacers 109b are arranged at the arrangement density D2 higher than the arrangement density D1. In this manner, with the second spacers 109b arranged at a higher density with respect to the curved part 112 where the cell gap tends to fluctuate, fluctuations of the cell gap can be reduced.

The positional relation for arranging the first spacers 109a and the second spacers 109b described above is schematically described by using FIG. 4.

Figure 4:
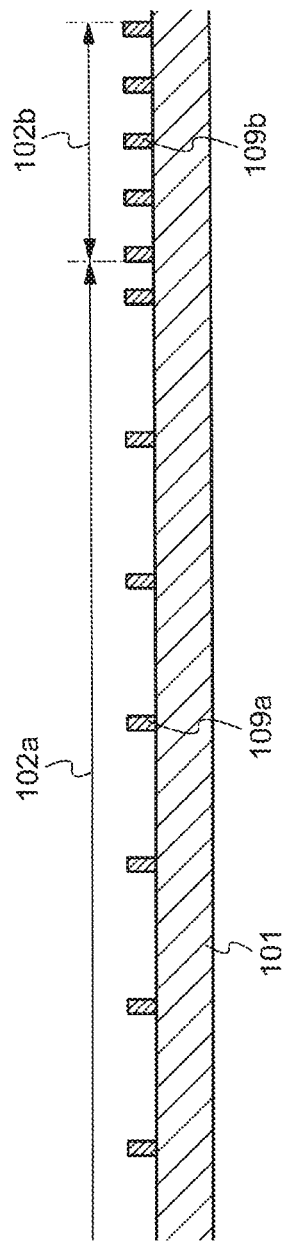
FIG. 4 is a diagram depicting a positional relation between first spacers and second spacers on an array substrate of the first embodiment.

FIG. 4 is a diagram depicting a positional relation between the array substrate 101 and the first spacers 109a and the second spacers 109b in the first embodiment. While the first spacers 109a and the second spacers 109b are arranged on the array substrate 101 in the present embodiment, this is not meant to be restrictive, and they may be arranged on the counter substrate 107. Also, the first spacers 109a and the second spacers 109b can be arranged on different substrates. For example, the first spacers 109a can be arranged on the array substrate 101 and the second spacers 109b can be arranged on the counter substrate 107. Conversely, the first spacers 109a can be arranged on the counter substrate 107 and the second spacers 109b can be arranged on the array substrate 101.

As depicted in FIG. 4, the display region 102 of the array substrate 101 has a first region 102a and a second region 102b. The first region 102a is a flat region or a mildly curved region in the display region 102. The second region 102b is a region positioned at the curved part 112 depicted in FIG. 3 in the display region 102. In the present embodiment, since a flat region 101a has no curvature (substantially a curvature of zero), the second region 102b has a curvature of the array substrate 101 larger than that of the first region 102a.

Here, the first region 102a is provided with the plurality of first spacers 109a at the arrangement density D1. Specifically, each first spacer 109a is arranged in a region between adjacent pixels 10 (for example, near a point of intersection between a scanning line and a video signal line). Normally, the region between the adjacent pixels 10 is light-shielded by the light-shielding member 217, and thus the first spacer 109a is arranged so as to be overlaid on the light-shielding member 217.

By contrast, the second region 102b is provided with the plurality of second spacers 109b at the arrangement density D2. Also, in this case, each second spacer 109b is arranged in a region between adjacent pixels 10 (specifically, at a position overlaid on the light-shielding member 217). The second region 102b is positioned in the curved part 112, and is thus viewed by an observer from a diagonal direction. Thus, the size of the light-shielding member 217 on the periphery of the second spacer 109b may be larger than the size of the light-shielding member 217 on the periphery of the first spacer 109a.

The display region 102 can be present over the entire curved part 112 or at some point in the curved part 112. However, since the liquid crystal layer 108 is present over the entire curved part 112 in the present embodiment, it is preferable to provide the second spacers 109b over the entire curved part 112 to maintain the cell gap in the curved part 112. Therefore, the second spacers 109b are arranged at the arrangement density D2 at least in the second region 102b.

As described above, in the present embodiment, the density of the spacers arranged in the curved part 112 is set higher than that of the other region. More specifically, the arrangement density D2 of the second spacers 109b arranged in the second region 102b with a curvature larger than that of the first region 102a is set higher than the arrangement density D1 of the first spacers 109a arranged in the first region 102a of the display region 102. This allows the cell gap in the curved part 112 in the liquid crystal display device 100 to be maintained.

In FIG. 4, a boundary between the first region 102a and the second region 102b corresponds to a start position of the curved part 112. Here, the second spacers 109b may be arranged across the first region 102a and the second region 102b. That is, a configuration may be adopted in which the second spacers 109b are arranged at the arrangement density D2 from a region inside the curved part 112 (that is, a part of the first region 102a) over the second region 102b.

Also, the second spacers 109b may contain a filling material such as a filler. This can reinforce the second spacers 109b and make them resistant deformation, thereby more suitably maintaining the cell gap in the curved part 112.

Furthermore, while the example has been described in which the columnar-shaped first spacers 109a and second spacers 109b are provided in the preset embodiment, any shape can be adopted.

Second Embodiment

In a second embodiment, an example is described in which a cushioning region is provided between the first region 102a and the second region 102b in the display region 102 of the first embodiment. In the present embodiment, description is made by focusing attention on a difference in structure from that of the liquid crystal display device 100 of the first embodiment, and the same structure is provided with the same reference character and its description is omitted.

Figure 5:
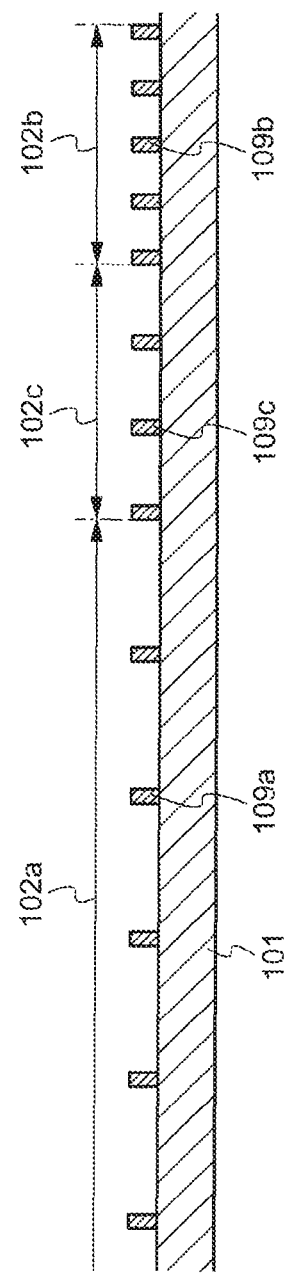
FIG. 5 is a diagram depicting a positional relation among the first spacers, the second spacers, and third spacers on an array substrate of a second embodiment.

FIG. 5 is a diagram depicting a positional relation among the first spacers 109a, the second spacers 109b, and third spacers 109c on the array substrate 101 of the second embodiment. As depicted in FIG. 5, the display region 102 of the present embodiment has a third region 102c between the first region 102a and the second region 102b. Also, the third spacers 109c are arranged in the third region 102c at an arrangement density D3.

Here, the arrangement density D3 of the third spacers 109c is lower than the arrangement density D2 of the second spacers 109b and is higher than the arrangement density D1 of the first spacers 109a. That is, on the array substrate 101 of the present embodiment, the plurality of spacers are arranged from the first region 102a over the second region 102b so that the arrangement density increases in a stepwise manner. Thus, the arrangement density of the spacers does not greatly change at the boundary portion between the first region 102a and the second region 102b, and the arrangement density of the spacers can be increased in a stepwise manner.

While the example has been described in which the third region 102c is provided so that the arrangement density of the spacers changes in a stepwise manner from the first region 102a over the second region 102b in FIG. 5, the arrangement density of the spacers can be changed in a continuous manner.

Figure 6:
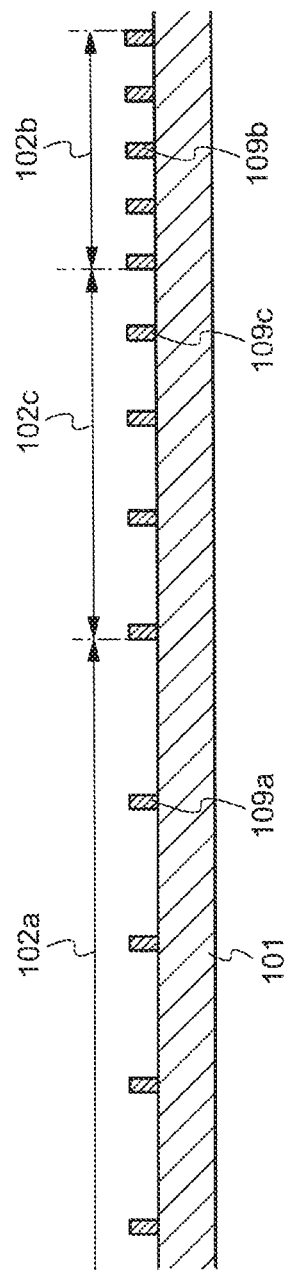
FIG. 6 is a diagram depicting a positional relation among the first spacer, the second spacer, and the third spacers on the array substrate of the second embodiment.

FIG. 6 is a diagram depicting a positional relation among the first spacers 109a, the second spacers 109b, and the third spacers 109c on the array substrate 101 of the second embodiment. In the example depicted in FIG. 6, the arrangement density D3 of the third spacers 109c increases as they are closer to the second region 102b in the third region 102c. That is, the plurality of spacers are arranged in FIG. 6 so that the arrangement density increases in a continuous manner at the boundary portion between the first region 102a and the second region 102b. Thus, the arrangement density of the spacers does not greatly change at the boundary portion between the first region 102a and the second region 102b, and the arrangement density of the spacers can be increased in a continuous manner.

Third Embodiment

In a third embodiment, an example is described in which spacers with different heights are arranged in the first region 102a and the second region 102b in the display region 102. In the present embodiment, description is made by focusing attention on a difference in structure from that of the liquid crystal display device 100 of the first embodiment, and the same structure is provided with the same reference character and its description is omitted.

Figure 7:
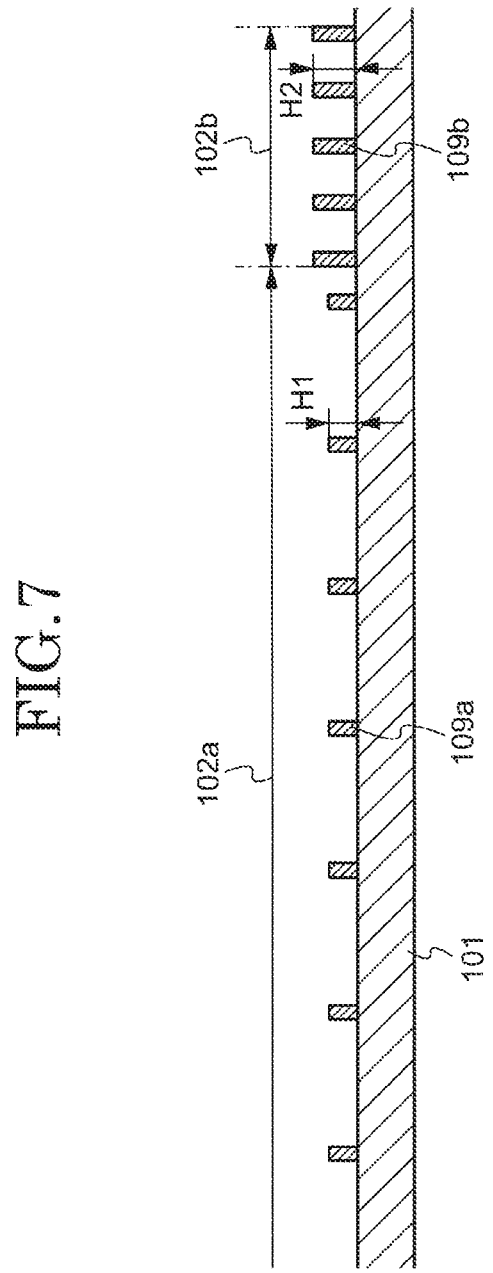
FIG. 7 is a diagram depicting a height relation between first spacers and second spacers formed on an array substrate of a third embodiment.

FIG. 7 is a diagram depicting a height relation between the first spacers 109a and the second spacers 109b formed on the array substrate 101 of the third embodiment. As depicted in FIG. 7, in the present embodiment, the first spacers 109a with a height H1 are arranged in the first region 102a, and the second spacers 109b with a height H2 are arranged in the second region 102b.

Here, the height H1 is a distance between the top of the first spacers 109a and the surface of the array substrate 101 where the first spacers 109a are formed. Also, the height H2 is a distance between the top of the second spacers 109b and the surface of the array substrate 101 where the second spacers 109b are formed.

Here, as depicted in FIG. 7, the height H2 of the second spacers 109b arranged in the second region 102b is higher than the height H1 of the first spacers 109a arranged in the first region 102a. In other words, the distance H2 between the top of the second spacers 109b and the surface of the array substrate 101 where the second spacers 109b are formed is longer than the distance H1 between the top of the first spacers 109a and the surface of the array substrate 101 where the first spacers 109a are formed.

In the curved part 112 depicted in FIG. 3, a force is applied from the array substrate 101 and the counter substrate 107 to a direction of pushing the liquid crystal layer 108. Thus, a stronger force may be applied to the spacers arranged in the curved part 112 compared with the other region (that is, a region that is not curved) to slightly deform the spacers.

Therefore, in the present embodiment, on the assumption that the spacers are slightly crushed, the second spacers 109b are formed in advance so as to be somewhat larger than the cell gap (the thickness of the liquid crystal layer 108) on a design basis. That is, if the thickness of the liquid crystal layer 108 on a design basis is d1, the height H1 of the first spacers 109a corresponds to the thickness d1. By contrast, the height H2 of the second spacers 109b is longer than the height H1 of the first spacers 109a, and thus the cell gap in the curved part 112 can be appropriately maintained even with some crushing. In this case, a thickness d2 of the liquid crystal layer 108 in the curved part 112 including the second region 102b may be equal to or thicker than the above-described thickness d1.

As described above, in the present embodiment, the height H2 of the second spacers 109b arranged in the second region 102b where the spacers tend to be crushed due to the curve is set longer than the height H1 of the first spacers 109a arranged in the first region 102a. This allows the cell gap in the curved part 112 to be appropriately maintained also in the liquid crystal display device of the present embodiment.

Also, in the present embodiment, the structure is not limited to that in which the first spacers 109a and the second spacers 109b are arranged on the array substrate 101, and the first spacers 109a and the second spacers 109b may be arranged on the counter substrate 107. Also, as with the first embodiment, the first spacers 109a and the second spacers 109b can be arranged on different substrates.

As a method of making the height of the first spacers 109a and the height of the second spacers 109b different from each other, for example, an exposure process using a halftone mask can be used. Also, a spacer forming process can be divided in a manner such that the first spacers 109a are first formed and then separately the second spacers 109b are formed. In this case, it is possible to form the second spacers 109b with a height equal to that of the first spacers 109a and then add spacers to the second spacers 109b in a different process to increase the height.

Fourth Embodiment

In a fourth embodiment, an example is described in which a cushioning region is provided between the first region 102a and the second region 102b in the display region 102 of the third embodiment. In the present embodiment, description is made by focusing attention on a difference in structure from that of the liquid crystal display device 100 of the first embodiment, and the same structure is provided with the same reference character and its description is omitted.

Figure 8:
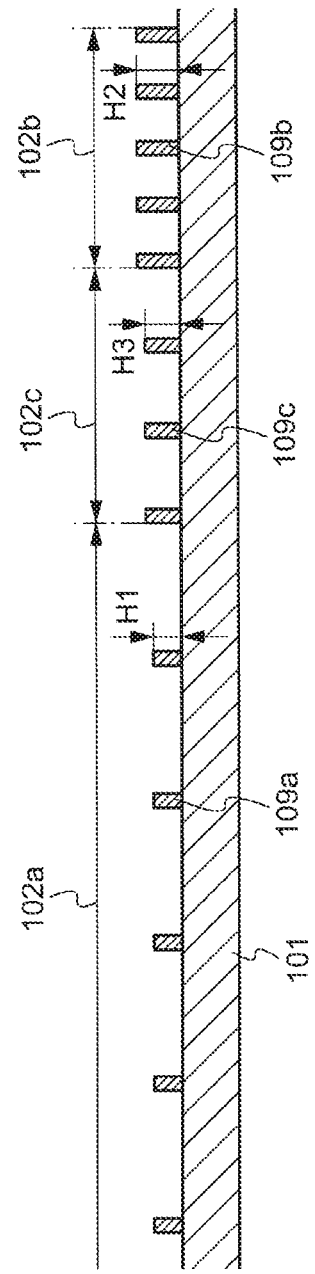
FIG. 8 is a diagram depicting a height relation among first spacers, second spacers, and third spacers on an array substrate of a fourth embodiment.

FIG. 8 is a diagram depicting a height relation among the first spacers 109a, the second spacers 109b, and the third spacers 109c on the array substrate 101 of the fourth embodiment. As depicted in FIG. 8, the display region 102 of the present embodiment has the third region 102c between the first region 102a and the second region 102b. Also, the third spacers 109c with a height H3 are arranged in the third region 102c.

Here, the height H3 of the third spacers 109c is lower than the height H2 of the second spacers 109b and higher than the height H1 of the first spacers 109a. That is, on the array substrate 101 of the present embodiment, the plurality of spacers are arranged from the first region 102a over the second region 102b so that the height increases in a stepwise manner. Thus, the height of the spacers does not greatly change at the boundary portion between the first region 102a and the second region 102b, and the height of the spacers can be increased in a stepwise manner.

While the example has been described in which the third region 102c is provided so that the height of the spacers changes in a stepwise manner from the first region 102a over the second region 102b in FIG. 8, the height of the spacers can be changed in a continuous manner.

Figure 9:
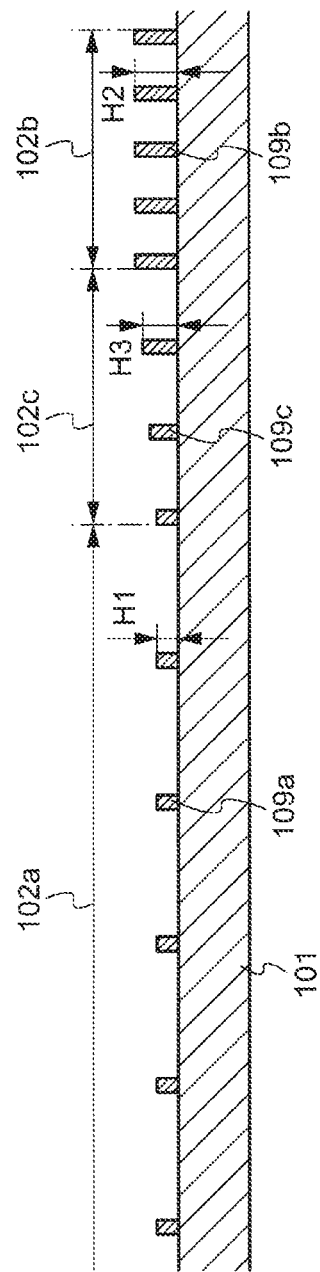
FIG. 9 is a diagram depicting a height relation among the first spacers, the second spacers, and the third spacers on the array substrate of the fourth embodiment.

FIG. 9 is a diagram depicting a height relation among the first spacers 109a, the second spacers 109b, and the third spacers 109c on the array substrate 101 of the fourth embodiment. In the example depicted in FIG. 9, the height H3 of the third spacers 109c increases as they are closer to the second region 102b in the third region 102c. That is, the plurality of spacers are arranged in FIG. 9 so that the height increases in a continuous manner at the boundary portion between the first region 102a and the second region 102b. Thus, the height of the spacers does not greatly change at the boundary portion between the first region 102a and the second region 102b, and the height of the spacers can be increased in a continuous manner.

Fifth Embodiment

In a fifth embodiment, an example is described in which spacer height adjustment is performed with a structure different from that of the third embodiment. In the present embodiment, description is made by focusing attention on a difference in structure from that of the liquid crystal display device 100 of the first embodiment, and the same structure is provided with the same reference character and its description is omitted.

Figure 10:
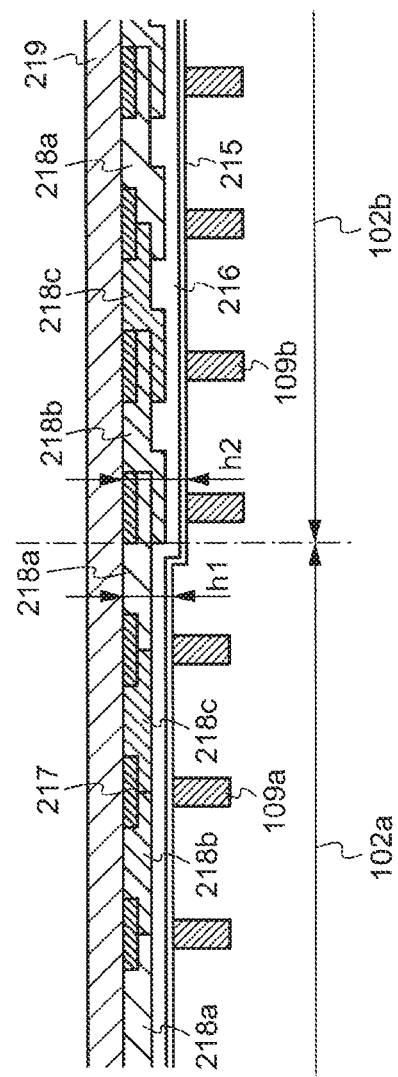
FIG. 10 is a diagram depicting a height relation of spacers on a counter substrate of a fifth embodiment.

FIG. 10 is a diagram depicting a height relation of spacers on the counter substrate 107 of the fifth embodiment. In the present embodiment, the first spacers 109a and the second spacers 109b are both provided on the counter substrate 107 and have the same height. However, a foundation at a position where the first spacers 109a are formed and a foundation at a position where the second spacers 109b are formed have different heights.

Specifically, a distance h2 between the bottom of the second spacers 109b and the surface of a second resin substrate 219 supporting the counter substrate 107 is longer than a distance h1 between the bottom of the first spacers 109a and the surface of the second resin substrate 219 supporting the counter substrate 107. Therefore, a distance from the surface of the second resin substrate 219 to the top of the second spacers 109b is longer than a distance from the surface of the second resin substrate 219 to the top of the first spacers 109a. Thus, as with the third embodiment, the cell gap in the curved part 112 can be appropriately maintained even if the second spacers 109b are somewhat crushed.

In the present embodiment, a light-shielding member 217, color filter members 218a to 218c respectively corresponding to RGB colors, an overcoat layer 216, and an alignment film 215 are provided between the bottom of the first spacers 109a and the second spacers 109b and the second resin substrate 219. Here, while the color filter members 218a to 218c are arranged in parallel in the first region 102a, at least two of the color filter members 218a to 218c are laminated in the second region 102b. Thus, the above-described distance h2 is longer than the distance h1 by the thickness of the color filter members 218a to 218c.

As described above, in the present embodiment, any of the plurality of components (the light-shielding member 217, the color filter members 218a to 218c, the overcoat layer 216, and the alignment film 215) configuring the counter substrate 107 is used to adjust the distance between the first spacers 109a and the second spacers 109b, and the second resin substrate 219. This allows the cell gap in the curved part 112 including the second region 102b to be appropriately maintained even with some crushing of the second spacers 109b.

While the example has been depicted in FIG. 10 in which at least two of the color filter members 218a to 218c are laminated for height adjustment, this is not meant to be restrictive. For example, a halftone mask may be used to make the film thickness of the overcoat layer 216 in the second region 102b thicker compared with the first region 102a. Also, all of the color filter members 218a to 218c can be laminated in the second region 102b to form a three-layer structure for height adjustment. Furthermore, height adjustment may be performed by using another component such as an inorganic insulating film not depicted.

Sixth Embodiment

In a sixth embodiment, a structure is described for preventing a positional shift of spacers with a relative positional shift between the array substrate 101 and the counter substrate 107. In the present embodiment, description is made by focusing attention on a difference in structure from that of the liquid crystal display device 100 of the first embodiment, and the same structure is provided with the same reference character and its description is omitted.

Figure 11:
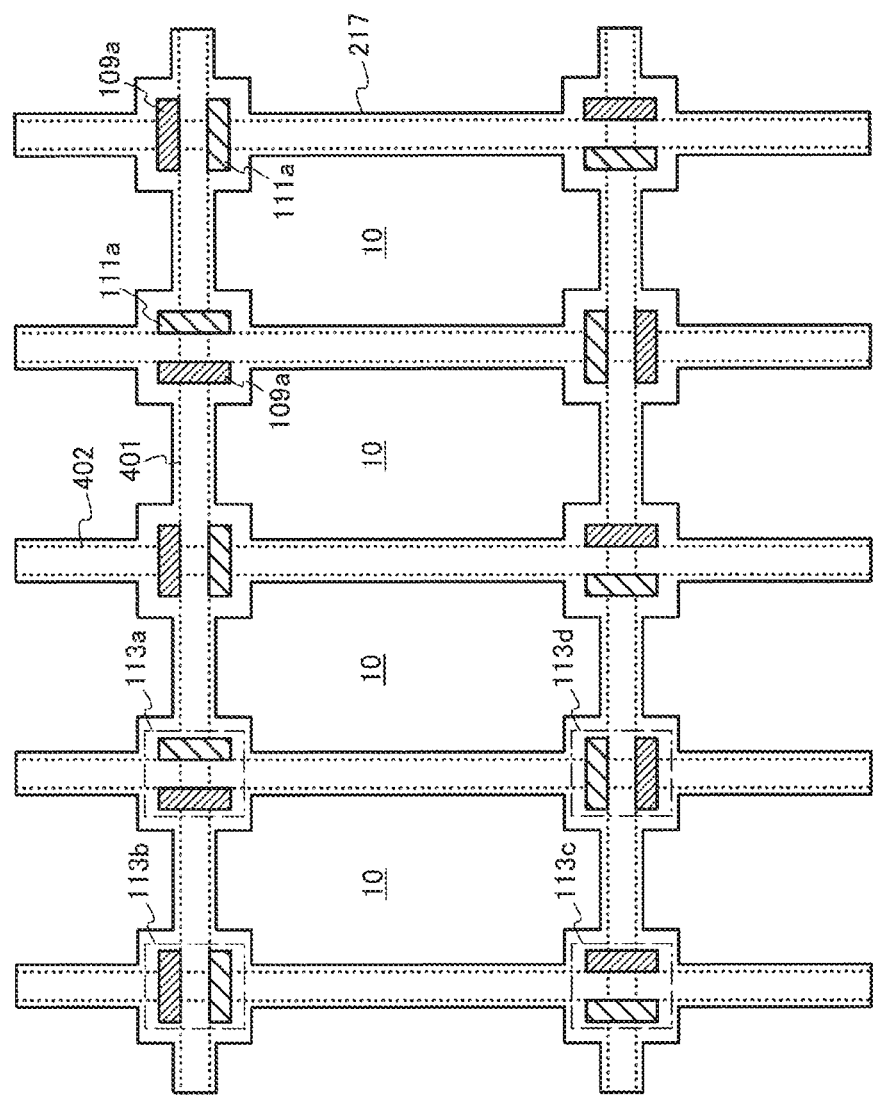
FIG. 11 is a plan view depicting a positional relation between first spacers and first protrusions in a display region of a sixth embodiment.

FIG. 11 is a plan view depicting a positional relation between the first spacers 109a and first protrusions 111a in a display region 102 of the sixth embodiment. In FIG. 11, in the first region 102a of the display region 102, the first spacers 109a and the first protrusions 111a are arranged. In the present embodiment, the first spacers 109a are arranged on the counter substrate 107 and the first protrusions 111a are arranged on the array substrate 101. Conversely, the first spacers 109a may be arranged on the array substrate 101 and the first protrusions 111a may be arranged on the counter substrate 107. In any case, the first spacers 109a and the first protrusions 111a are arranged on different substrates.

As depicted in FIG. 11, the first region 102a includes scanning lines 401 and video signal lines 402 crossing the scanning lines 401, and regions surrounded by the scanning lines 401 and the video signal lines 402 function as pixels 10. Each of the first spacers 109a and each of the first protrusions 111a are arranged so as to be adjacent to each other near a point of intersection of the scanning line 401 and the video signal line 402 in a planar view.

Here, as depicted in FIG. 11, a side surface of the first spacer 109a and a side surface of the first protrusion 111a oppose each other. Also in the first region 102a, there are a first set 113a where a side surface of the first spacer 109a and a side surface of the first protrusion 111a oppose each other in the direction in which the scanning line 401 extends and a second set 113b where a side surface of the first spacer 109a and a side surface of the first protrusion 111a oppose each other in the direction in which the video signal line 402 extends.

Furthermore, in the first region 102a, there are a third set 113c where a positional relation between the first spacer 109a and the first protrusion 111a is reverse to that of the first set 113a and a fourth set 113d where a positional relation between the first spacer 109a and the first protrusion 111a is reverse to that of the second set 113b.

Figure 12:
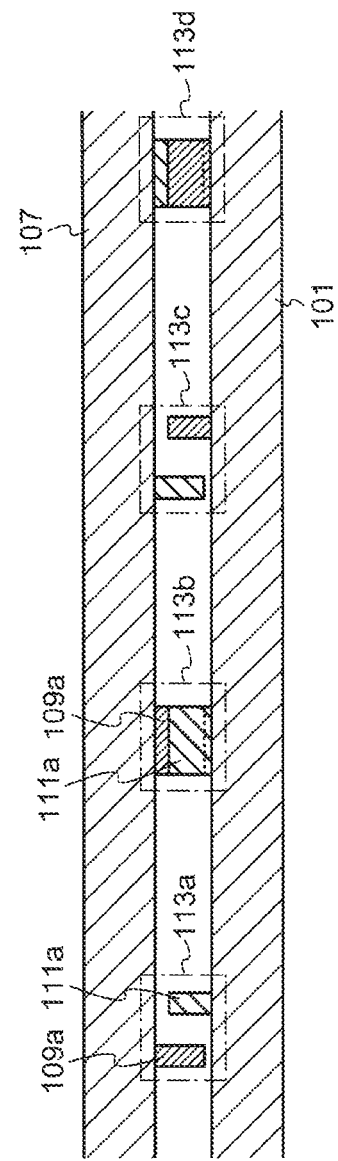
FIG. 12 is a sectional view depicting a positional relation between the first spacers and the first protrusions in the display region of the sixth embodiment.

FIG. 12 is a sectional view depicting a positional relation between the first spacers 109a and the first protrusions 111a in the display region 102 of the sixth embodiment. As described above, the first spacers 109a are arranged on the counter substrate 107 and the first protrusions 111a are arranged on the array substrate 101. Also, the first spacers 109a and the first protrusions 111a are adjacent to each other so that their side surfaces oppose each other in a predetermined direction.

According to the present embodiment, even if some force is applied to the liquid crystal cell 110 to cause a relative positional shift between the array substrate 101 and the counter substrate 107, with the provision of the first set 113a and the third set 113c, the first protrusion 111a functions as a wall for preventing a positional shift of the first spacer 109a in a lateral direction (a direction parallel to the surface of the array substrate 101 or the counter substrate 107). Thus, in the present embodiment, with the first protrusion 111a arranged, a positional shift in a lateral direction of the first spacer 109a (left direction or right direction in FIG. 12) can be prevented.

Furthermore, in the present embodiment is provided with the above-described second set 113b and fourth set 113d. In the second set 113b and the fourth set 113d, the side surface of the first spacer 109a and the side surface of the first protrusion 111a are arranged so as to oppose each other in a direction crossing the direction in which the first spacer 109a and the first protrusion 111a in the first set 113a oppose each other. Therefore, even if the first spacer 109a is shifted in a vertical direction (upward direction or downward direction in FIG. 11), that shift can be appropriately stopped at the first protrusion 111a.

While the example has been depicted in FIG. 11 and FIG. 12 in which the first spacers 109a and the first protrusions 111a each have a plate shape in a planar view, both can each have an L shape.

Figure 13:
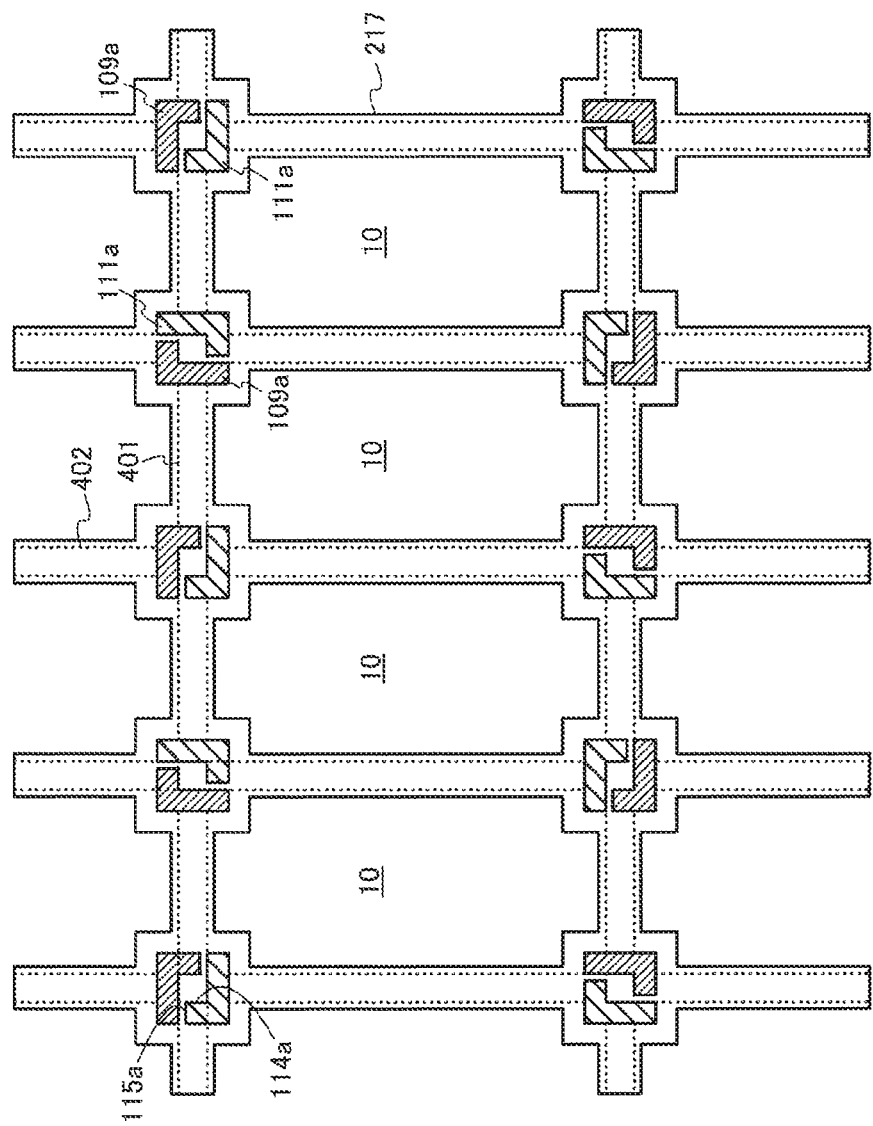
FIG. 13 is a plan view depicting the positional relation between the first spacers and the first protrusions in the display region of the sixth embodiment.

FIG. 13 is a plan view depicting the positional relation between the first spacers 109a and the first protrusions 111a in the display region 102 of the sixth embodiment. In the example depicted in FIG. 13, each of the first spacers 109a and each of the first protrusions 111a are arranged so as to overlap in the direction in which the scanning line 401 extends and a direction in which the video signal line 402 extends.

In other words, the first protrusion 111a depicted in FIG. 13 has a first side surface 114a opposing a side surface of the first spacer 109a in a direction in which the scanning line 401 extends and a second side surface 115a opposing a side surface of the first spacer 109a in a direction in which the video signal line 402 extends. With this, the first spacer 109a makes contact with the first side surface 114a of the first protrusion 111a when the first spacer 109a is positionally shifted in the direction in which the scanning line 401 extends and makes contact with the second side surface 115a of the first protrusion 111a when the first spacer 109a is positionally shifted in the direction in which the video signal line 402 extends. Therefore, even if the first spacer 109a is shifted in any direction, this shift can be appropriately stopped at the first protrusion 111a.

While the first region 102a of the display region 102 has been exemplarily described as to the above-described structure, the second region 102b is also in a similar structure. Therefore, the effect of the present embodiment can be achieved also in the second region 102b. In particular, in the second region 102b, a relative positional shift between the array substrate 101 and the counter substrate 107 tends to occur. However, for example, as with the first embodiment, by setting the density of the second spacers 109b in the second region 102b higher than that in the first region 102a, the positional shift can be further appropriately reduced.

Seventh Embodiment

In a seventh embodiment, a structure is described for preventing an outflow of the liquid crystal layer 108 in the curved part 112. In the present embodiment, description is made by focusing attention on a difference in structure from that of the liquid crystal display device 100 of the first embodiment, and the same structure is provided with the same reference character and its description is omitted.

Figure 14:
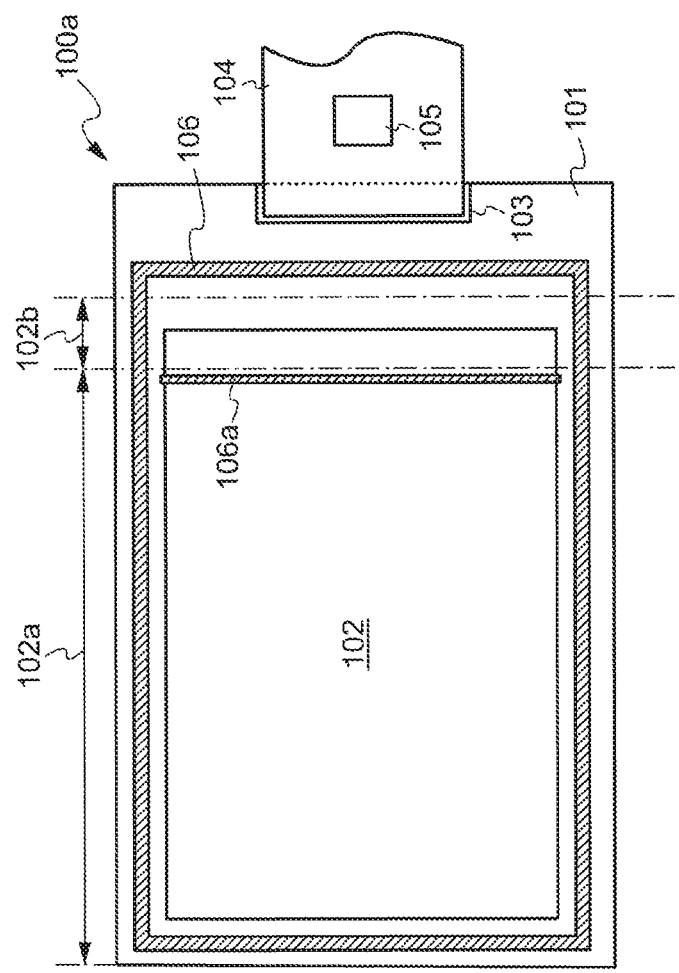
FIG. 14 is a plan view depicting a positional relation of a second protrusion in a liquid crystal display device of a seventh embodiment.

FIG. 14 is a plan view depicting a positional relation of the second protrusion in a liquid crystal display device 100a of the seventh embodiment. In the present embodiment, a second protrusion 106a is arranged separately from the first spacers 109a and the second spacer 109b near the boundary between the first region 102a and the second region 102b. As depicted in FIG. 14, the second protrusion 106a is arranged along an extending direction of a curve axis of the array substrate 101 (a direction along the two-dot-chain line 112a depicted in FIG. 1, which is a bending position of the curved part 112).

The second protrusion 106a may be formed in the same process as that of the first spacers 109a or the second spacers 109b or may be formed separately from the first spacers 109a and the second spacers 109b.

As described above, when the liquid crystal display device 100a is bent along the extending direction of the curve axis, a force is active in the curved part 112 in a direction of pushing the liquid crystal layer 108. The liquid crystal layer 108 pushed by this force flows in a direction from the second region 102b toward the first region 102a. This phenomenon also serves as a factor in narrowing the cell gap in the curved part 112.

In the above-described first to fifth embodiments, with the action of the second spacers 109b arranged in the second region 102b, the cell gap in the curved part 112 can be appropriately maintained. In the present embodiment, in addition to the action of the second spacers 109b, the liquid crystal layer 108 flowing out from the curved part 112 is reduced to allow the cell gap to be further appropriately maintained. That is, in the present embodiment, the second protrusions 106a function as a wall for preventing an outflow of the liquid crystal layer 108.

The second protrusion 106a may be arranged on either of the array substrate 101 and the counter substrate 107 but is preferably arranged so as to make contact with both of the array substrate 101 and the counter substrate 107.

Also, in the direction in which the curve axis extends, an end of the second protrusion 106a may or may not make contact with the sealant 106. When the end of the second protrusion 106a makes contact with the sealant 106, the outflow of the liquid crystal layer 108 can be more effectively prevented. However, the liquid crystal layer 108 has to be individually formed for the first region 102a and the second region 102b by using an ODF (One Drop Fill) scheme or the like. When the end of the second protrusion 106a and the sealant 106 do not make contact with each other as depicted in FIG. 14, the liquid crystal layer 108 can be formed by using an ODF scheme, a vacuum injection scheme, or the like. However, an outflow of the liquid crystal layer 108 may occur to some extent.

Also, while the example has been described in the present embodiment in which the second protrusion 106 is arranged in the first region 102a near the boundary between the first region 102a and the second region 102b, this is not meant to be restrictive. For example, the second protrusion 106a can be arranged in the second region 102b near the boundary between the first region 102a and the second region 102b. Furthermore, as in the second embodiment or the fourth embodiment, when the third region 102c is provided between the first region 102a and the second region 102b, the second protrusion 106a is arranged near the boundary between the first region 102a and the third region 102c.

Also, while the second protrusion 106a is arranged as a linear member continuously extending in a curve axis direction in the present embodiment, this is not meant to be restrictive. For example, a configuration may be adopted in which a plurality of linear members are aligned with predetermined spaces in the curve axis direction or a plurality of linear members are aligned in parallel in a direction crossing the curve axis direction.

Eighth Embodiment

Figure 15:
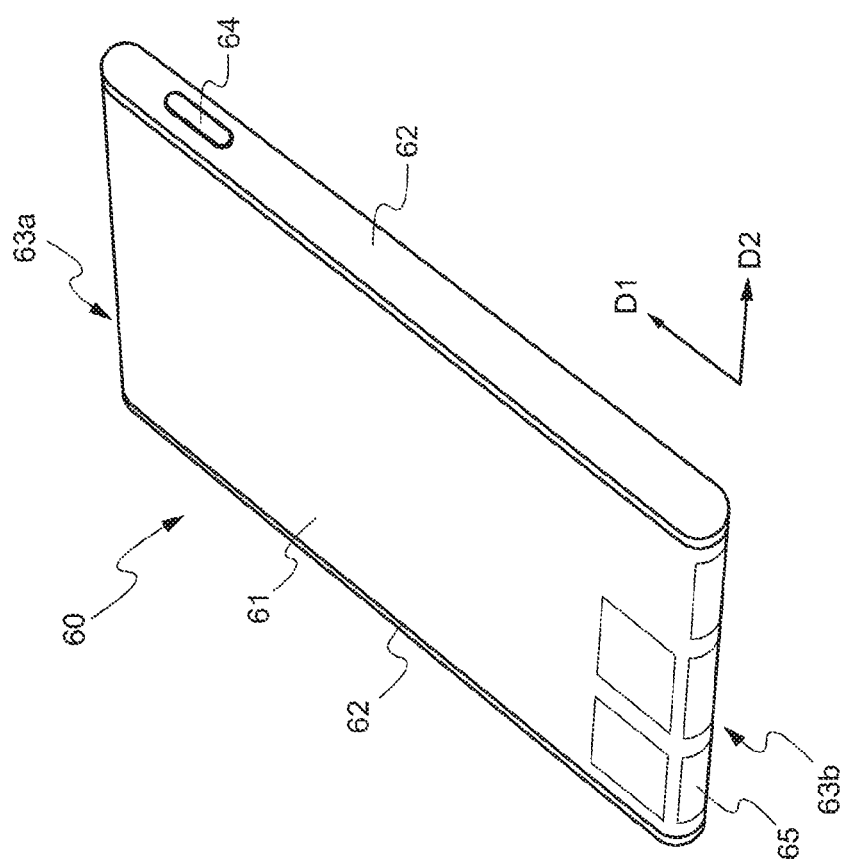
FIG. 15 is a perspective view depicting an electronic device having mounted thereon the liquid crystal display device of the present invention.

FIG. 15 is a perspective view depicting one example of an electronic device 60 having mounted thereon the liquid crystal display device of the present invention. Specifically, a portable terminal (smartphone) is exemplarily depicted as the electronic device 60. However, the electronic device 60 is not limited to the portable terminal but can be applied to any information terminal with a display screen, such as a tablet terminal.

The electronic device 60 depicted in FIG. 15 includes a display screen 61 and a frame section 62. The display screen 61 is a screen for displaying video by using the display region 102 depicted in FIG. 1. In the present embodiment, while most of the display screen 61 is flat, ends 63a and 63b are curved. The frame section 62 functions as a housing of the electronic device 60. The frame section 62 is referred to as a bezel. The frame section 62 may be provided with an input section 64 configured of hardware such as a power supply button.

The liquid crystal display device of the present invention can be bent so as to include the display region 102. Thus, as depicted in FIG. 15, when the electronic device 60 is viewed in a planar view, the display screen 61 in a D1 direction can be curved along the ends 63a and 63b. In this manner, with the display screen 61 bent at the ends 63a and 63b, an object 65 configuring a user interface such as an icon can be displayed in the electronic device 60 also on its curved portion.

Furthermore, in the electronic device 60 of the present embodiment, consideration is given to a wiring layout so that a portion of the frame section 62 positioned on the same plane as the display screen 61 is as narrow as possible. This allows the display region 102 to be effectively utilized at maximum for both of the D1 direction and the D2 direction so as to serve as a display screen of the electronic device 60.

Ninth Embodiment

In a ninth embodiment, an example is described in which the liquid crystal display device is bent along two sides different from those of the eighth embodiment.

Figure 16:
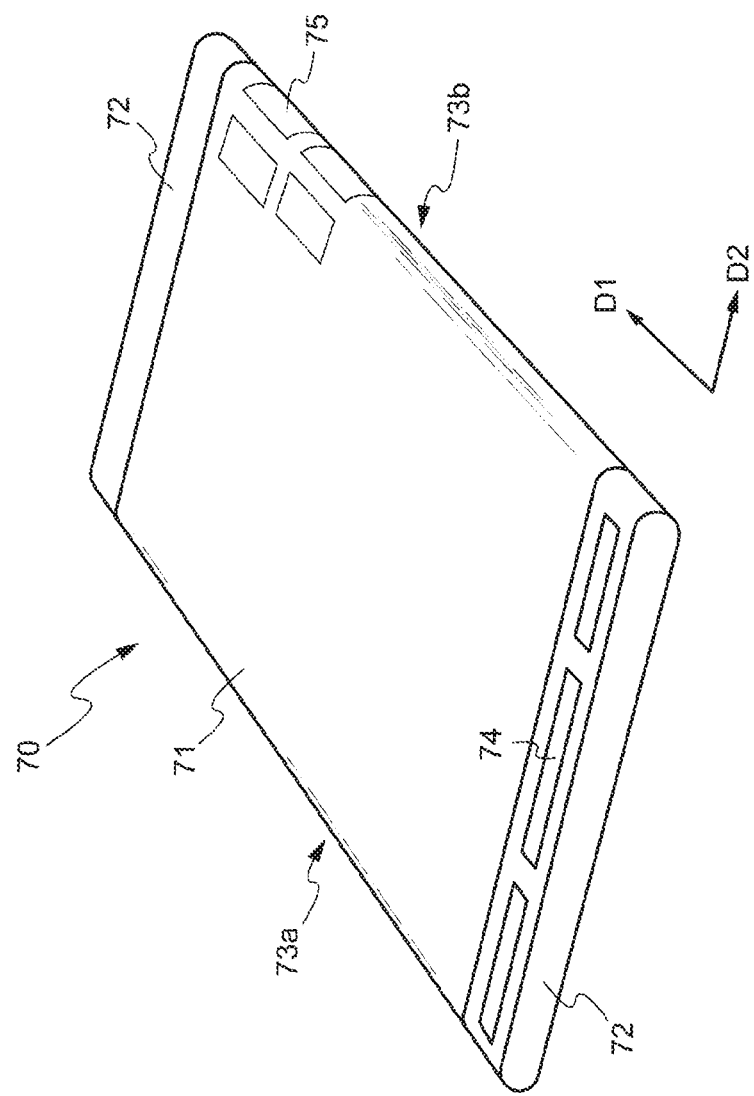
FIG. 16 is a perspective view depicting an electronic device having mounted thereon the liquid crystal display device of the present invention.

FIG. 16 is a perspective view depicting one example of an electronic device 70 having mounted thereon the liquid crystal display device of the present invention. Specifically, a portable terminal (smartphone) is exemplarily depicted as the electronic device 70. However, the electronic device 70 is not limited to the portable terminal but can be applied to any information terminal with a display screen, such as a tablet terminal.

As with the electronic device 60 depicted in FIG. 15, the electronic device 70 includes a display screen 71, a frame section 72, and curved ends 73a and 73b. In the present embodiment, the ends 73a and 73b in a D2 direction of the display screen 71 are curved in a planar view. The frame section 72 is provided with an input section 74 configured of hardware such as a power supply button. Also, on the ends 73a and 73b, an object 75 configuring a user interface such as an icon can be displayed.

Tenth Embodiment

In a tenth embodiment, an example is described in which the entire display screen 71 of the electronic device 70 described in the ninth embodiment is curved.

FIG. 17 is a perspective view depicting an example of an electronic device 80 having mounted thereon the liquid crystal display device of the present invention. Also, in the present embodiment, a portable terminal (smartphone) is exemplarily described, although this is not meant to be restrictive.

As with the electronic device 70 depicted in FIG. 16, the electronic device 80 includes a display screen 81, a frame section 82, and curved ends 83a and 83b. In the present embodiment, the entire display screen 81 is mildly curved in a D2 direction and is curved at the ends 83a and 83b at a radius of curvature smaller than that near the center of the display screen 81. Thus, the electronic device 80 is in a shape of an elliptic cylinder.

In the present embodiment, as with the ninth embodiment, the frame section 82 is provided with an input section 84 configured of hardware such as a power supply button. Also, on the ends 83a and 83b, an object 85 configuring a user interface such as an icon can be displayed.

In each of the embodiments described above, description is made to a liquid crystal display device by way of example. However, an electronic apparatus having the liquid crystal display device in each embodiment incorporated therein can be included in the scope of the present invention. Here, the electronic apparatus refers to a general apparatus using the liquid crystal display device as a display medium such as a portable information terminal.

The embodiments described above as embodiments of the present invention can be implemented as being combined as appropriate as long as combinations are not contradictory to one another. Also, addition, deletion, or design change of a component or addition, omission, or change in condition of a step made as appropriate by a person skilled in the art based on the display device of each embodiment is included in the scope of the present invention as long as they have the gist of the present invention.

Even operations and effects that are different from those brought by the modes of each of the above-described embodiments but are evident from the description of the specification or can be easily predicted by a person skilled in the art are construed as those naturally brought by the present invention.

What is claimed is:

1. A liquid crystal display device comprising:
   a first substrate having a display region;
   a second substrate;
   a liquid crystal layer between the first substrate and the second substrate;
   a plurality of first spacers formed on one of the first substrate and the second substrate and contacting with another one thereof; and
   a plurality of second spacers formed on one of the first substrate and the second substrate and contacting with another one thereof, wherein
   the display region has a first region and a second region with a curvature of the first substrate larger than a curvature of the first region,
   the plurality of first spacers is between the first substrate and the second substrate in the first region,
   the plurality of second spacers is between the first substrate and the second substrate in the second region, and
   an arrangement density D2 of the plurality of second spacers is higher than an arrangement density D1 of the plurality of first spacers.

2. The liquid crystal display device according to claim 1, further comprising:
   a plurality of third spacers formed on the first substrate or the second substrate, wherein
   the display region further has a third region between the first region and the second region,
   the plurality of third spacers is between the first substrate and the second substrate in the third region, and
   an arrangement density D3 of the plurality of third spacers is lower than the arrangement density D2 and higher than the arrangement density D1.

3. The liquid crystal display device according to claim 2, wherein
   the arrangement density D3 in the third region increases as being closer to the second region.

4. A liquid crystal display device comprising:
   a first substrate having a display region;
   a second substrate;
   a liquid crystal layer between the first substrate and the second substrate;
   a plurality of first spacers formed on one of the first substrate and the second substrate and contacting with another one thereof; and
   a plurality of second spacers formed on one of the first substrate and the second substrate and contacting with another one thereof, wherein
   the display region has a first region and a second region with a curvature of the first substrate larger than a curvature of the first region,
   the plurality of first spacers is between the first substrate and the second substrate in the first region,
   the plurality of second spacers is between the first substrate and the second substrate in the second region, and
   a distance H2 between a top of the second spacers and a surface of either one of the first substrate and the second substrate where the second spacers are formed is longer than a distance H1 between a top of the first spacers and a surface of either one of the first substrate and the second substrate where the first spacers are formed.

5. The liquid crystal display device according to claim 4, further comprising:
   a plurality of third spacers formed on the first substrate or the second substrate, wherein
   the display region further has a third region between the first region and the second region,
   the plurality of third spacers is between the first substrate and the second substrate in the third region, and
   a distance H3 between a top of the third spacers and a surface of either one of the first substrate and the second substrate where the third spacers are formed is shorter than the distance H2 and longer than the distance H1.

6. The liquid crystal display device according to claim 5, wherein
the distance H3 in the third region increases as being closer to the second region.

7. A liquid crystal display device comprising:
a first substrate having a display region;
a second substrate;
a liquid crystal layer between the first substrate and the second substrate;
a plurality of first spacers formed on the second substrate and contacting with the first substrate; and
a plurality of second spacers formed on the second substrate and contacting with another the first substrate, wherein
the display region has a first region and a second region with a curvature of the first substrate larger than a curvature of the first region,
the plurality of first spacers is in the first region,
the plurality of second spacers is in the second region, and
a distance h2 between a bottom of the second spacers and a support substrate of the second substrate is longer than a distance h1 between a bottom of the first spacers and the support substrate.

8. The liquid crystal display device according to claim 4, wherein
a thickness d2 of the liquid crystal layer in the second region is equal to or thicker than a thickness d1 of the liquid crystal layer in the first region.

9. The liquid crystal display device according to claim 1, further comprising:
signal lines and scanning lines in the display region; and
a plurality of first protrusions formed in the first substrate, wherein
the plurality of first spacers is provided on the second substrate,
each of the first spacers and each of the first protrusions are adjacent to each other near a point of intersection between each of the signal lines and each of the scanning lines in a planar view, and
a side surface of the first spacer and a side surface of the first protrusion face each other.

10. The liquid crystal display device according to claim 9, wherein
the first protrusion has a first side surface facing the side surface of the first spacer in a first direction and a second side surface facing the side surface of the first spacer in a second direction crossing the first direction.

11. The liquid crystal display device according to claim 1, further comprising:
a second protrusion formed on the first substrate or the second substrate and extending in a curve axis direction of the first substrate, wherein
the second protrusion is in the first region or near a boundary between the first region and a region adjacent to the first region.

12. The liquid crystal display device according to claim 1, wherein
the plurality of second spacers is provided across the first region and the second region.

13. The liquid crystal display device according to claim 2, wherein
the plurality of second spacers is provided across the first region and the second region.

14. The liquid crystal display device according to claim 3, wherein
the plurality of second spacers is provided across the first region and the second region.

15. The liquid crystal display device according to claim 4, wherein
the plurality of second spacers is provided across the first region and the second region.

16. The liquid crystal display device according to claim 5, wherein
the plurality of second spacers is provided across the first region and the second region.

17. The liquid crystal display device according to claim 6, wherein
the plurality of second spacers is provided across the first region and the second region.

18. The liquid crystal display device according to claim 7, wherein
the plurality of second spacers is provided across the first region and the second region.

19. The liquid crystal display device according to claim 8, wherein
the plurality of second spacers is provided across the first region and the second region.

20. The liquid crystal display device according to claim 9, wherein
the plurality of second spacers is provided across the first region and the second region.

* * * * *